(12) United States Patent
Antoniadis et al.

(10) Patent No.: US 7,319,440 B2
(45) Date of Patent: Jan. 15, 2008

(54) ORGANIC LIGHT EMITTING DIODE LIGHT SOURCE

(75) Inventors: Homer Antoniadis, Mountain View, CA (US); Karl Pichler, Santa Clara, CA (US)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/687,283

(22) Filed: Oct. 15, 2003

(65) Prior Publication Data

US 2004/0075395 A1 Apr. 22, 2004

Related U.S. Application Data

(63) Continuation of application No. 09/955,617, filed on Sep. 19, 2001, now Pat. No. 6,680,578.

(51) Int. Cl.
G09G 3/12 (2006.01)
G09G 3/10 (2006.01)

(52) U.S. Cl. .................. 345/36; 345/46; 315/169.3

(58) Field of Classification Search ............ 315/169.1, 315/169.2, 169.3; 345/30, 80, 82, 83, 33, 345/36, 38–39, 48
See application file for complete search history.

(56) References Cited

U.S. PATENT DOCUMENTS

| | | | |
|---|---|---|---|
| 5,247,190 A | 9/1993 | Friend et al. | 437/1 |
| 5,399,502 A | 3/1995 | Friend et al. | 438/29 |
| 5,869,350 A | 2/1999 | Heeger et al. | 257/40 |
| 5,895,986 A | 4/1999 | Walters et al. | 307/117 |
| 5,936,302 A | 8/1999 | Pedersen et al. | 257/665 |
| 5,972,419 A | 10/1999 | Roitman | 313/503 |
| 5,986,400 A | 11/1999 | Staring et al. | 313/503 |
| 5,994,496 A | 11/1999 | Van Haare et al. | 528/376 |
| 6,014,119 A | 1/2000 | Staring et al. | 345/82 |
| 6,087,776 A | 7/2000 | Yamashita et al. | 315/82 |

(Continued)

FOREIGN PATENT DOCUMENTS

EP 0 880 303 A1 11/1998

(Continued)

OTHER PUBLICATIONS

A.R. Duggal et al., "Organic Light-Emitting Devices for Illumination Quality White Light", May 13, 2002, Applied Physics Letters, American Institute of Physics, New York, U.S., pp. 3470-3472.

Primary Examiner—Shih-Chao Chen
Assistant Examiner—Minh Dieu A
(74) Attorney, Agent, or Firm—Fish & Richardson P.C.

(57) ABSTRACT

A novel OLED light source and method for controlling said OLED light source panel are disclosed wherein said light source is constructed such that active areas are segmented and said segments are separately addressable. In one embodiment, the segments are a series of RGB lines or stripes and the control unit may separately drive each individual stripe or may drive all separate color lines or may drive separate lines within a given region on the panel. In another embodiment, the stripes of the panel are connected to control lines that are either current limited or have a fuse that serves to obviate a current runaway condition on the panel. In another embodiment, the output light chromaticity of the panel is controlled either by users or by light sensors.

28 Claims, 2 Drawing Sheets

U.S. PATENT DOCUMENTS

| | | |
|---|---|---|
| 6,160,354 A | 12/2000 | Ruvinskiy et al. ....... 315/169.3 |
| 6,201,520 B1 | 3/2001 | Iketsu et al. .................. 345/76 |
| 6,441,395 B1 | 8/2002 | Yu et al. ........................ 257/40 |
| 6,452,576 B1 | 9/2002 | Van Velzen et al. .......... 345/82 |
| 6,680,578 B2 * | 1/2004 | Antoniadis et al. ...... 315/169.3 |
| 6,871,951 B2 * | 3/2005 | Blum et al. ................. 351/159 |
| 2003/0010892 A1 * | 1/2003 | Clark ..................... 250/208.1 |

FOREIGN PATENT DOCUMENTS

| | | |
|---|---|---|
| EP | 1 003 229 A1 | 5/2000 |
| JP | 2000-056732 | 2/2000 |
| WO | WO 99/66483 A1 | 12/1999 |
| WO | WO 00/06665 A1 | 2/2000 |
| WO | WO 00/3662 A1 | 6/2000 |

* cited by examiner

ORGANIC LIGHT EMITTING DIODE LIGHT SOURCE

CROSS-REFERENCE TO RELATED APPLICATIONS

This application is a continuation of application Ser. No. 09/955,617, filed Sep. 19, 2001, U.S. Pat. No. 6,680,578 and titled "Organic Light Emitting Diode Light Source".

BACKGROUND OF THE INVENTION

The use of OLED panels as sources of light is desirable—such as for area lighting in the workplace and for the home. However, the use of OLED panels for such light source uses has its own attendant set of problems for both design and manufacture. In particular, the OLED light source might be needed to provide lighting in unusual corners of a space—so flexibility of the light source is possibly desirable. Additionally, exacting fault tolerances in an OLED light source for general lighting purposes does not need to be on the same par as perhaps an OLED light source for a computer display—where human attention would be most acutely focused. Thus, there is an opportunity to design an OLED general light source with an eye towards ease of manufacture to reduce cost and improve reliability.

Thus, it is desirable to be able to design and manufacture such OLED light sources for general area lighting that take advantage of the specific general lighting usage to either maximize efficiency and reliability, flexibility or minimize cost of manufacture.

SUMMARY OF THE INVENTION

The present invention discloses a novel OLED light source and method for controlling said OLED light source panel are disclosed wherein said light source is constructed such that active areas are segmented and said segments are separately addressable. In one embodiment, the segments are a series of RGB lines or stripes and the control unit may separately drive each individual stripe or may drive all separate color lines or may drive separate lines within a given region on the panel. In another embodiment, the stripes of the panel are connected to control lines that are either current limited or have a fuse that serves to obviate a current runaway condition on the panel. In another embodiment, the output light chromaticity of the panel is controlled either by users or by light sensors. Specifically, the chromaticity could be controlled by individual control of the different color sub-units (e.g. segments or stripes) of the OLED light source.

In another embodiment the independent control of the different color subunits is used to allow for better matching of the different color sub-units to achieve the desired overall chromaticity, in particular white. Thus, a non-optimum RGB set of segments, stripes or lines can still achieve an acceptable white color.

In yet another embodiment, the present invention could be employed with either individual OLED light source elements are all of the same color or whereby the individual elements have different colors.

DETAILED DESCRIPTION OF THE INVENTION

Figure 1:
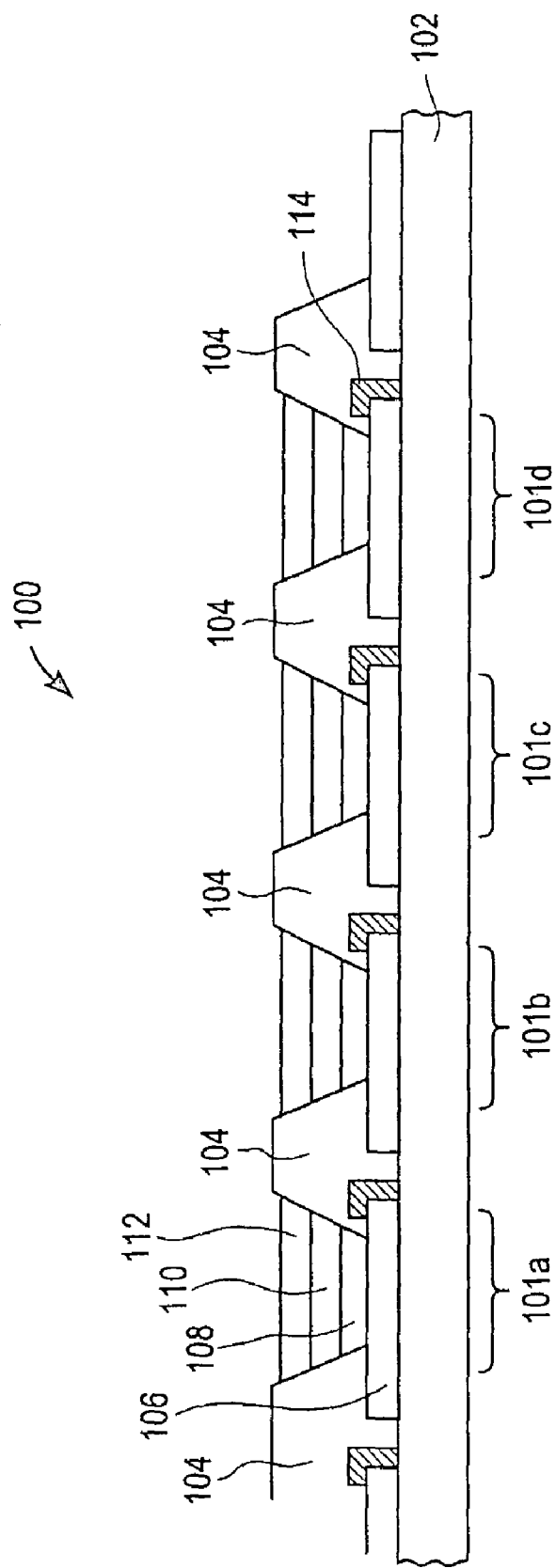
FIG. 1 is a side cut view of an OLED light source made in accordance with the principles of the present invention.

Referring now to FIG. 1, one embodiment of an OLED light source 100 is shown in side cut view. Panel 100 comprises a transparent substrate 102 that could be either a semi rigid glass or a flexible polymer substrate having suitable transparency. Examples of plastic substrates are: Polyetheneterephthalate (PET), Polyethylenenapthalate (PEN), Polyestercarbonate (PC), Polyethersulphone (PES), Polyimide (PI) and the like. Within the active area, a layer of transparent conductor (such as ITO, IZO or the like, or conductive polymer such as Pedot/PSS or Pani) 106 is laid down and patterned in any manner known in the art as a suitable anode structure. Optionally, a separate bus line 114 comprising a suitable metal or metal alloy line could be deposited on top of the transparent conductor line 106. Such a bus line would decrease the overall resistance of the "stripe" across the light source panel. This is especially true since the resistance of the ITO stripes becomes very large for any reasonably sized stripe and the panel would have to be operated at high voltage to drive the anode current.

In one embodiment, the anode-to-anode distance could be 10–100 microns and the bus lines could be 1–50 microns wide and a few 100 nm thick. In another embodiment, for large area OLED light sources, the anode-to-anode distance might be >0.1 mm; the bus lines could be wider and the metal could only be a over 1 micron thick.

Deposited upon the substrate, ITO lines and optional bus lines are a plurality of separators 104, possibly made from insulating material like photoresist, or other inorganic photolithographically patternable materials like $SiO_x$ or $SiN_x$ that serve to isolate the various stripes on the light source. In another embodiment, insulating separators are not needed. It would be sufficient to patterning the anode on an insulating substrate such as for example glass to provide the necessary electrical isolation.

A plurality of organic layers 108 and 110 may be thereafter deposited on top of the anode structure. Layer 108 would typically be a hole injection layer comprising either a conducting polymer (Pedot, Pani, or the like) or hole transporting small molecule (e.g. CuPc, starburst amine); while layer 110 would typically be an optimized molecular or polymeric organic light-emitting material which emits, for example, white light or other colors such as red, green or blue (R,G,B) light. These materials are electroluminescent small organic or organo-metallic molecules or conjugated polymers, copolymers or blends thereof or even small molecule dispersions in polymer binders that emit light from either excited singlet or triplet states or both whereby the excitation is created by the recombination of positive and negative charge carriers injected into the layer from the electrodes; in case of emission from triplet states these may also be created via energy transfer from singlet states and vice versa. In general, organic electroluminescent device stacks as generally known in the prior art.

The active layers might be deposited in any manner known in the art; and more particularly, could be deposited selectively via ink jet printing (continuous stream, drop-on demand, micro-contact printing, etc.), screen printing, offset printing, electrostatic printing, gravure printing, flexographic printing, laser-induced thermal transfer, shadow stencil masking (for thermally evaporated small molecules) or other. Additionally, thermal induced transfer printing methods are also possible—using separate master transfer sheets if R,G,B lines are to be printed sequentially.

As a separate consideration for the construction of an OLED light source, the thickness of layer 108 may be much larger than that used in the construction of an OLED pixel display. Typically, for a display pixel, the thickness of the hole injecting layer may be on the order of approximately 0.1–0.2 microns. For a light source panel, this layer can be a thick conducting polymer layer of more than 0.2 microns, up to several microns thick.

The advantage is that large particle impurities (of size of about 1 micron) that find their way on the surface of the active panel during manufacture can be nicely coated and covered under the thick polymer layer. As a result these covered particles will not represent a pinpoint defect, which otherwise would have shorted anode and cathode. This would substantially improve the yield on the production line for OLED light sources. In addition due to relatively high conductivity of the thick conducting polymer, relatively low voltage will be dropped across this layer.

In another embodiment, the conducting layer could typically be approximately 0.2 microns but a thicker (hence more conductive) Pedot or Pani (or other conductive polymer) layer could be added to the panel to insure that individual OLED light source segments are not sharply defined but have diffuse edges which often enhances the perceived light source quality/uniformity. Alternatively, this can also be achieved by thinner conducting polymer layers (for example 0.2 microns thick or less) but with higher conductivity formulations of said conducting polymer layer; such formulations are generally known in the prior art (see for example product information from Bayer AG, Germany, Baytron™ or Baytron P™ product lines).

Finally, on top of the plurality of polymer layers, a cathode structure 112 is deposited, comprising a suitable low work function metal or alloy. Either the cathode structure could be uniformly electrically connected across the panel or the cathode structure could be similarly segmented or striped as the anode structure previously mentioned.

It will be appreciated that there are several alternative embodiments that are contemplated by the scope of the present invention. For example, in an alternative embodiment, the bottom electrode is not patterned and the top electrode is. Additionally, the role of the top and bottom conductor layers could be reversed—i.e. the bottom electrode is the cathode and the top electrode is the anode.

In the foregoing embodiment, it will be appreciated that light will tend to be emitted through the glass or polymer substrate 102 to provide light for a viewer. In another embodiment of the present invention, substrate 102 could be comprised of a stainless steel foil (or other suitable metallic substrate or metallized plastic foil). Layers 108 and 110 would be present as before; but that conductive layer 112 would be a suitable low work function transparent layer comprised of a very thin low work function metal followed by an ITO layer. In such an embodiment, light would be emitted past the conductive layer 112 onto the viewer. The metallic substrate 102 in this embodiment would have desirable thermal conductive properties in order to move away the heat produced by the OLED light source. An example of such a metallic substrate is a stainless steel foil (or other metallic foils) of thickness similar to conventional flexible plastic substrates. The metal (conductor) in the metal foil, metallized plastic foil may be partially covered with an insulator layer; specifically, the foil could be a plastic foil (insulating) with thicker (non transparent) patterned metal to define the individually addressable OLED segments of the invention. In particular, the work function of the metal in such a metallized foil could be higher than 4 eV to facilitate and ease the injection of holes into the hole injection layer (eg. conducting polymer) under forward bias.

If the transparent substrate is glass or plastic, then it might be desirable for the surfaces of the substrate be frosted or roughened in order to provide a requisite amount of diffusion to the output light. Additionally, the substrate might have light "extraction" properties and be optimized for light extraction from its surface. In this case the outer surface of the substrate may be textured or patterned with microstructures, for example embossed or laminated micro-lenses, to allow escape of trapped light rays in the transparent substrate or a brightness enhancement film may be laminated to the substrate at the light-output side.

The pixel areas 101 a, b, c, and d could be fabricated such that the stripes—are either a monochrome light such as white light or alternating R, G, B colors or combination of two alternating colors (R,G or G,B or R,B) or even any single color. In the RGB embodiment, a range of visual effects could be made—depending upon selective activation of the stripes or segments. Thus, a uniform white light could be produced or any hue in the visible spectrum could be effected by selective driver electronics, as discussed below.

One design consideration of a suitable OLED light source is its current requirement. For a one square meter light source with a luminance of 100 cd/square meter, the current requirement is approximately 10 Amps, if the photometric efficiency is 10 cd/A. Conducting such a large current through the substrate may not be practical; thus causing large voltage drops across the conductors or even accelerating possible current runaways. In such a case, a single defect (caused by a particle or film imperfection) may be the reason for shorting the entire panel due to shorting of the anode or cathode.

Thus, it might be desirable to individually address each R, G, B stripe by a current source whose current in limited by a circuit to avoid current runaways. One embodiment might be to have a shared continuous cathode (anode) structure for all stripes; but individually address each anode (cathode).

Furthermore this method of making white light allows the use of optimum OLED structures of different colors to mix these with various current densities to get the desired color hue (whites of different temperature may be a choice) having the most optimized efficiency. This approach of achieving an emission color, for example white, based on individually patterned and efficiency-optimized separate colors (such as RGB), allows for a higher overall light source efficiency than the efficiency achieved by fabricating a white-emitting OLED stripe or segment. In particular, each RGB individual segment can be held at its own optimized voltage (for light output and efficiency), for each color respectively, to optimize the overall OLED light source output and efficiency.

Figure 2:
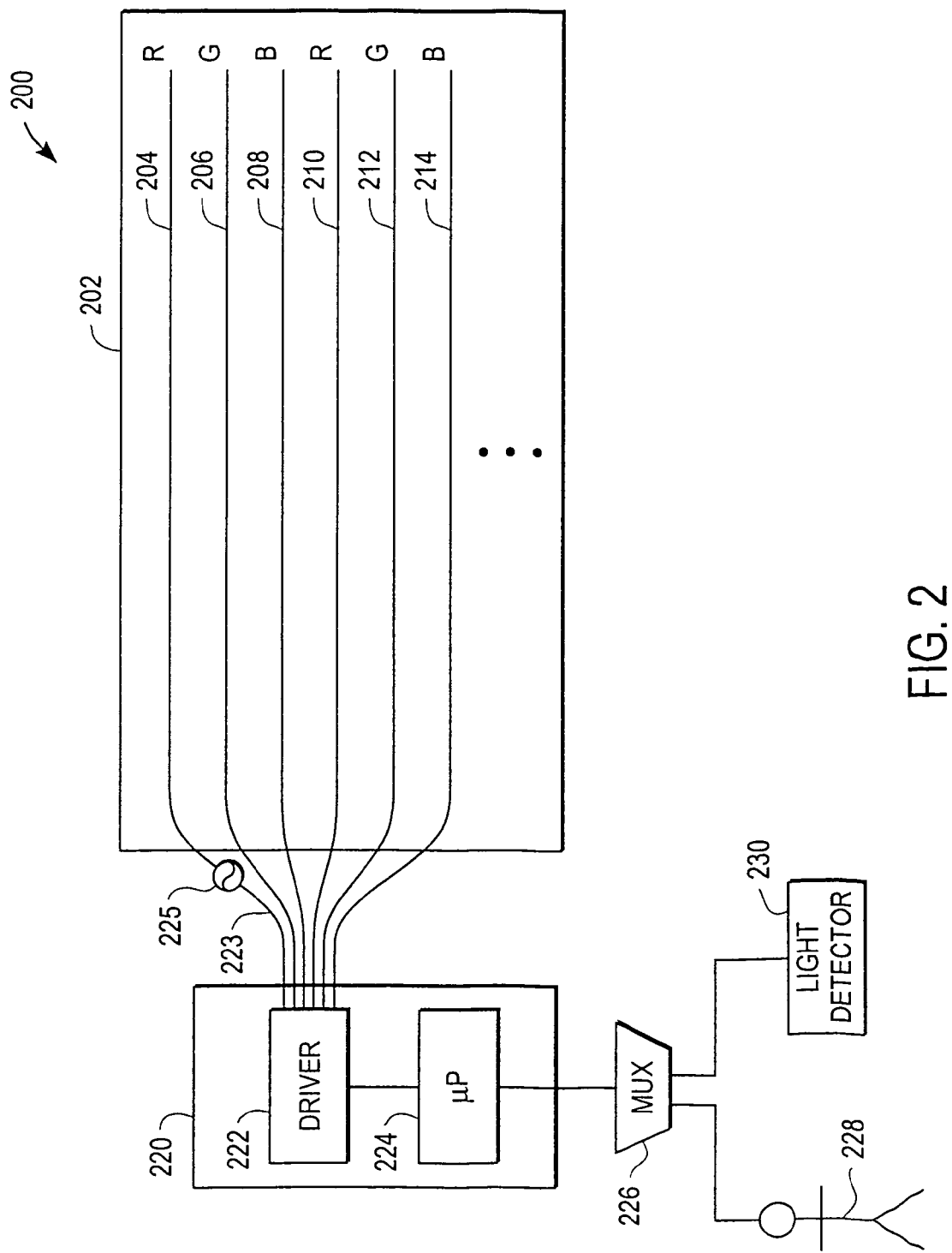
FIG. 2 is a top view of an OLED light source made in accordance with the principles of the present invention.

FIG. 2 is a top view of an OLED light source embodiment 200, as made in accordance with the principles of the present invention. Light source 200 broadly comprises light source area 202 and a control unit 220. It will be appreciated that the light source area and the control unit could be constructed separately or integrally on a panel surface—or any portion of the control unit could be constructed integrally on the light source area, depending upon the needs of the light source itself.

Light source area—in this embodiment—comprises alternating RGB pixel lines 204–214 to provide either a uniform white light source or any hue that might arise as a result of mixing different RGB intensities. This level of chromaticity control could be accomplished according to the input of a user 228 or a light/color sensor 230 that would indicate the precise temperature of white light or which color hue to output from the panel. Such input could be optionally controlled by a microprocessor 224 which would then apply suitable control signals to the driver electronics 222.

It will be appreciated that as each color segment or stripe is independently addressable, certain lines could be turned on/off or modulated in any fashion well known in the art. Alternatively, the control circuitry could be such that groups of stripes are addressable—such as all R, G, or B stripes are addressable; or that stripes within certain regions of the panel are addressable (e.g. all stripes in the upper half and all stripes in the lower half are addressable) or a combination of addressing color and region is also possible and well known within in the art.

For fault tolerant construction and operation of the OLED light source, it might be desirable that each control line 223 be current limited, so that if a short is experienced in one particular stripe or segment, that short does not cause a catastrophic current runaway and short the entire panel. Alternatively, each control line 223 could be have constructed (integrally or otherwise) a fuse 225 that would blow if the current within a given stripe exceeds a given threshold. This would ensure that one stripe failure—although not generally noticeable—would not be a catastrophic failure of the entire panel.

It will be appreciated that although FIG. 2 depicts that the panel is segmented into stripes that form rows of the panel, the segmentation of the presently claimed panel could be different than that depicted. For example, the segmentation could be stripes that form the columns of the panel. Alternatively, the segments could define a pixel area of the panel. In another alternative, the stripe need not extend the full active area of the panel—but could have two (or more stripe) that extend a fractional way across the panel. It will be appreciated that there are many ways in which the panel could be segmented and individually addressed.

A novel OLED light source has now been disclosed by the foregoing discussion. It will be appreciated that the scope of the present invention should not be limited by the disclosure of any particular embodiment herein. Instead, the proper scope of the present invention includes and contemplates any and all obvious variations of the foregoing.

The invention claimed is:

1. An OLED light source comprising:
    a substrate;
    a first electrode formed on said substrate;
    one or more organic electroluminescent active layers formed on said first electrode;
    a second electrode on said one or more organic electroluminescent active layers to form an active segment, wherein the light source includes a plurality of separately addressable active segments and each said segment has a length significantly greater than its width;
    a driver circuit electrically connected to said segments, wherein each segment is individually controllable by said driver circuit such that the chromaticity of light output from said light source is selectable by mixing different intensities of emitted light of the segments.

2. The OLED light source as recited in claim 1 wherein said substrate comprises transparent glass.

3. The OLED light source as recited in claim 1 wherein said first electrode comprises ITO.

4. The OLED light source as recited in claim 1 wherein said substrate comprises a flexible plastic transparent material, a flexible metal foil, a flexible metalized plastic foil, a plastic foil comprising a conducting polymer layer as a conductor or a plastic foil comprising a conducting polymer layer with metal bus bars as a conductor layer.

5. The OLED light source as recited in claim 1 wherein said substrate includes a metallic foil comprising a high work function metal.

6. The OLED light source as recited in claim 1 wherein:
    said first electrode comprises Pedot, Pani or a conducting polymer; and
    a low conductivity metal bus line is connected to said first electrode.

7. The OLED light source as recited in claim 1 wherein said first electrode is a anode and said second electrode is a cathode.

8. The OLED light source as recited in claim 1 wherein said first electrode is a cathode and said second electrode is an anode.

9. The OLED light source as recited in claim 1 wherein said one or more organic electroluminescent active layers comprise a hole injection layer of approximately one micron in thickness.

10. The OLED light source as recited in claim 9 wherein said hole injection layer comprises a conducting polymer.

11. The OLED light source as recited in claim 1 wherein said one or more organic electroluminescent active layers comprise small organic molecules, organo-metallic molecules, conjugated polymers or small molecule dispersions.

12. The OLED light source as recited in claim 1 wherein said one or more organic electroluminescent active layers is deposited using ink jet printing, screen printing, off-set printing, electrostatic printing, gravure printing, flexographic printing, laser-induced or thermally induced transfer printing, or shadow stencil masking.

13. The OLED light source as recited in claim 1 wherein said driver circuit is electrically connected to said segment by a control line and said control line is current limited.

14. The OLED light source as recited in claim 1 wherein said segment has a linear shape.

15. The OLED light source as recited in claim 1 wherein said segment extends across a full active area of said OLED light source.

16. The OLED light source of claim 1, wherein the first electrode and the second electrode extend in a same direction.

17. A method for controlling output light from an organic light emitting diode light source, the light source including a plurality of separately addressable active segments, said segments comprising RGB lines, the light source also including a controller for selectively driving each segment such that the chromaticity of light output from said light source is selectable by mixing different intensities of emitted light of the segments, the method comprising:
    inputting color information to said controller; and
    driving individually said segments according to said input color information such that the output light from said light source correlates to said input color information, wherein each segment has a length significantly greater than its width.

18. The method as recited in claim 17 wherein said step of inputting color information further comprises inputting color information received from a user.

19. The method as recited in claim 17 wherein said step of inputting color information further comprises inputting color information received from a light sensor.

20. The method as recited in claim 17 wherein said step of driving individually said segments further comprises separately driving groups of red segments, groups of green segments, and groups of blue segments in said light source.

21. The method as recited in claim 17 wherein said step of driving individually said segments further comprises separately driving separate regions of said light source.

22. The method of claim 17, wherein each active segment comprises a first electrode and a second electrode, wherein the first electrode and the second electrode extend in a same direction.

23. A fault-tolerant OLED light source comprising:
  a plurality of independently addressable light segments, each segment of said plurality of segments electrically isolated from one another such that an electrical short in one segment of said plurality of segments does not short any other light segment; and
  a controller capable of driving said plurality of independently addressable light segments such that the chromaticity of light output from said light source is selectable by mixing different intensities of emitted light of the segments, wherein each segment has a length significantly greater than its width.

24. The fault-tolerant OLED light source as recited in claim 23 further comprising a means for limiting current so that during operation of the light source, current flowing to each segment is limited such that a short in one segment does not short all of the segment of the light source.

25. The fault-tolerant OLED light source as recited in claim 21, wherein the first electrode and the second electrode extend in a same direction.

26. An OLED light source, comprising:
  a substrate including a metallic foil comprising a metal with a work function greater than 4 eV;
  a first electrode formed on the substrate, comprising indium tin oxide or a conducting polymer, wherein a metal bus line is connected to the first electrode;
  an organic electroluminescent active layer formed on said first electrode;
  a second electrode on the electroluminescent active layer, wherein the first electrode, electroluminescent active layer and second electrode form an individually addressable segment, the first electrode and second electrode are aligned in one direction and the segment has a length greater than its width; and
  a driver circuit electrically connected to the segment, wherein the segment is controllable by the driver circuit so that the chromaticity of light output from the light source is selectable.

27. The light source of claim 26 wherein the conducting polymer is one of poly(3,4-ethylenedioxythiophene) or polyaniline.

28. The light source of claim 26, wherein the segment extends a full active area of the OLED light source.

* * * * *

UNITED STATES PATENT AND TRADEMARK OFFICE
CERTIFICATE OF CORRECTION

PATENT NO. : 7,319,440 B2 Page 1 of 1
APPLICATION NO. : 10/687283
DATED : January 15, 2008
INVENTOR(S) : Homer Antoniadis and Karl Pichler It is certified that error appears in the above-identified patent and that said Letters Patent is hereby corrected as shown below:

Column 6, Line 12 at Claim 7; replace:
"said first electrode is a anode and said second electrode is a" with
-- said first electrode is an anode and said second electrode is a --

Column 7, Line 24 at Claim 24; replace:
"does not short all of the segment of the light source" with
-- does not short all of the segments of the light source --

Column 7, Line 26 at Claim 25; replace:
"claim 21, wherein the first electrode and the second elec-" with
-- claim 23, wherein the first electrode and the second elec- --

Signed and Sealed this

Thirteenth Day of May, 2008

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,319,440 B2 | Page 1 of 1 |
| APPLICATION NO. | : 10/687283 | |
| DATED | : January 15, 2008 | |
| INVENTOR(S) | : Homer Antoniadis and Karl Pichler | |

It is certified that error appears in the above-identified patent and that said Letters Patent is hereby corrected as shown below:

On the Title page item (56), References Cited, Page 2, Foreign Patent Documents; replace:

"WO 00/3662  A1     6/2000" with

-- WO 00/36662  A1     6/2000 --

Signed and Sealed this

Seventh Day of October, 2008

JON W. DUDAS
*Director of the United States Patent and Trademark Office*